US006563753B1

United States Patent
Rickes et al.

(10) Patent No.: US 6,563,753 B1
(45) Date of Patent: May 13, 2003

(54) SENSE AMPLIFIER WITH INDEPENDENT WRITE-BACK CAPABILITY FOR FERROELECTRIC RANDOM-ACCESS MEMORIES

(75) Inventors: Jurgen T. Rickes, Los Altos Hills, CA (US); Hugh P. Mc Adams, Mc Kinney, TX (US); James W Grace, Los Altos Hills, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/991,571

(22) Filed: Nov. 16, 2001

(51) Int. Cl.[7] .................................................. G11C 7/00
(52) U.S. Cl. .................... 365/205; 365/207; 365/189.01
(58) Field of Search .............................. 365/205, 207, 365/189.01, 189.05, 230.06, 230.08

(56) References Cited

U.S. PATENT DOCUMENTS 4,085,457 A * 4/1978 Itoh ............................ 365/205
5,396,464 A * 3/1995 Slemmer ................. 365/189.01

OTHER PUBLICATIONS

A Survey of Circuit Innovations in Ferroelectric Random–Access Memories Ali Sheikholeslami & Glenn P. Gulak Proceedings of the IEEE, vol. 88, No. 5, May 2000.

* cited by examiner

Primary Examiner—David Lam
(74) Attorney, Agent, or Firm—Pamela Lau Kee

(57) ABSTRACT

A sensing circuit with independent write-back capability includes a write back function block having a write-back output signal, a sense amplifier that receives an input and a reference signal. The sense amplifier generates an output signal and the write back function block further receives this output signal. An optional data buffer also receives the output signal.

6 Claims, 3 Drawing Sheets

N-CHANNEL INPUT

P-CHANNEL INPUT

SENSE AMPLIFIER WITH INDEPENDENT WRITE-BACK CAPABILITY FOR FERROELECTRIC RANDOM-ACCESS MEMORIES

BACKGROUND

The digital differential comparator, shown in FIG. 1, has been used in Dynamic Random-Access memories (DRAMs), as well as Static Random-Access memories (SRAMs). However, this circuit usually finds application in the data path external to the memory array itself, amplifying the data signal received from the memory array and passing it on to the output buffer. Since this circuit lacks any ability to write-back onto the input nodes, and since it is somewhat more complex than the traditional latching sense amplifier, shown in FIG. 2, it does not normally find use in the memory array itself.

Ferroelectric memories are superior to EEPROMs and Flash memories in terms of write-access time and overall power consumption. They are used in applications where a non-volatile memory is required with these features, e.g. digital cameras and contact less smart cards. Contact less smart cards require non-volatile memories with low power consumption as they use only electromagnetic coupling to power up the electronic chips on the card. Digital cameras require both low power consumption and fast frequent writes in order to store and restore an entire image into the memory in less than 0.1 seconds.

A typical read access of a ferroelectric memory consists of a write access followed by sensing. To illustrate, a "0" is written to the ferroelectric capacitor to discover the original data content of the memory cell. If the original content of the memory cell is a "1", writing a "0" reverses the direction of the polarization within the ferroelectric capacitor. This induces a large current spike on the sense wire. On the other hand, there is no current spike on the sensing wire if the original content of the ferroelectric capacitor was also a "0". Therefore, by sensing the presence of a current spike on the sensing wire, the original data of the accessed ferroelectric capacitor are determined.

The read operation as described is destructive since a "0" is written to any memory cell that is accessed for a read. The original data, however, are saved in the sense amplifier and can be restored back into the accessed memory cell. In other words, a read access is only complete after the second write that restores the original data.

SUMMARY

A sensing circuit with independent write-back capability includes a sense amplifier that receives an input and a reference signal and a tri-statable write-back block receiving a write enable signal and the sense amplifier's output signal. An optional data buffer also receives the sense amplifier's output signal.

DETAILED DESCRIPTION

Figure 1:
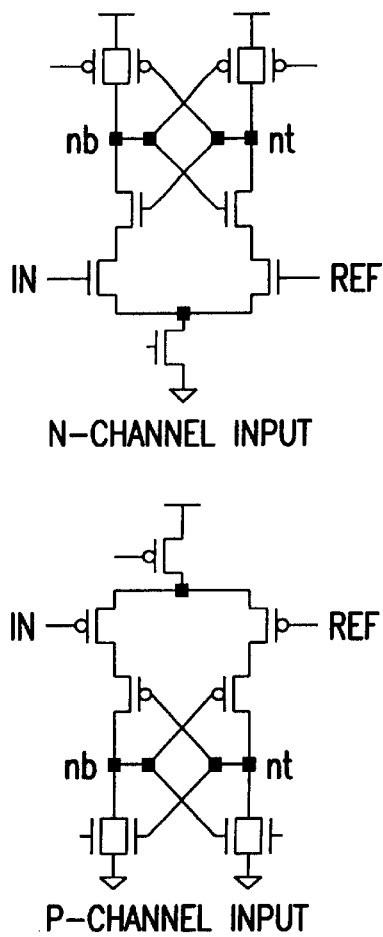
FIG. 1 illustrates a digital differential comparator of the prior art.
Figure 2:
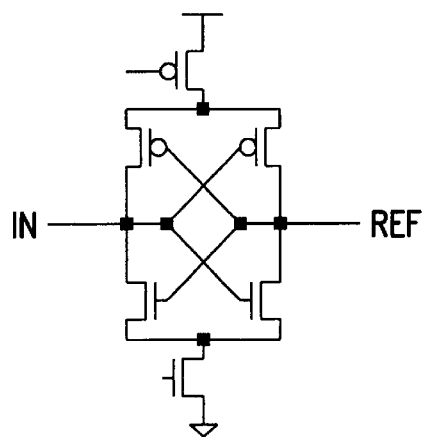
FIG. 2 illustrates as prior art latching sense amplifier.

The optimum number of cells per bit line of a ferroelectric memory tends to be larger than that of a DRAM. Therefore, a somewhat more complex sense amplifier can be more easily tolerated, since there are fewer partitions of the memory array and the cell efficiency tends to be higher. The higher bit line capacitance of the FeRAM, due to the larger number of bits, means that use of a prior latching sense amplifier (shown in FIG. 2) results in even slower access time. Since an adequate voltage separation between bit line and bit line bar must occur before they can be coupled to the output data path, additional time is required to charge or discharge the heavily loaded bit lines.

Figure 3:
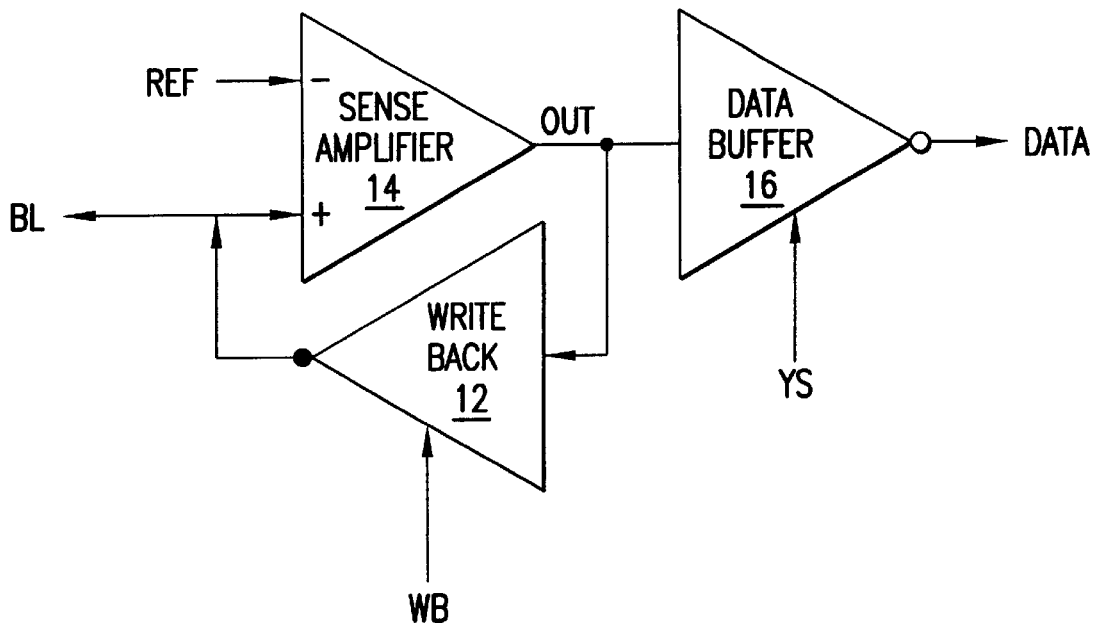
FIG. 3 illustrates a functional block diagram of the present invention.

A functional block diagram lo of the present invention is shown in FIG. 3. The write-back function block 12 is enabled by input signal WB. During operation, the sense amplifier compares the voltage on the bit line (BL) to the voltage on the reference input (REF). The sense amplifier's output signal (OUT) is received by the write-back function block 12. An optional data buffer 16 also receives the output signal. Thus, the heavily loaded bit line is separated from the lightly loaded internal sensing nodes.

Figure 4:
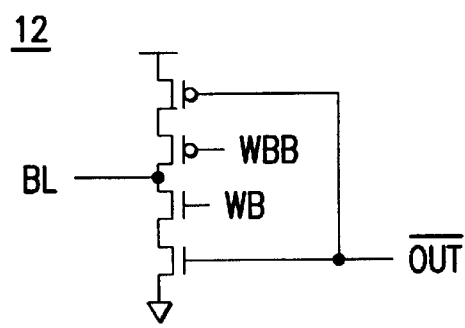
FIG. 4 illustrates the write-back function block shown in FIG. 3.

FIG. 4 illustrates the write-back function block 12 shown in FIG. 3. Serially connected from power to ground are a first and second p-channel transistor followed by a first and a second n-channel transistor. The BL signal is connected to the node between the second p-channel transistor and first n-channel transistor. The gates of the first p-channel transistor and the second n-channel transistor are tied together to node OUT bar which is the complement of the sense amplifier's output signal OUT. The gate of the second p-channel transistor receives a control signal write-back bar (WBB) while the gate of the first n-channel transistor receives a control signal write-back (WB).

Figure 5:
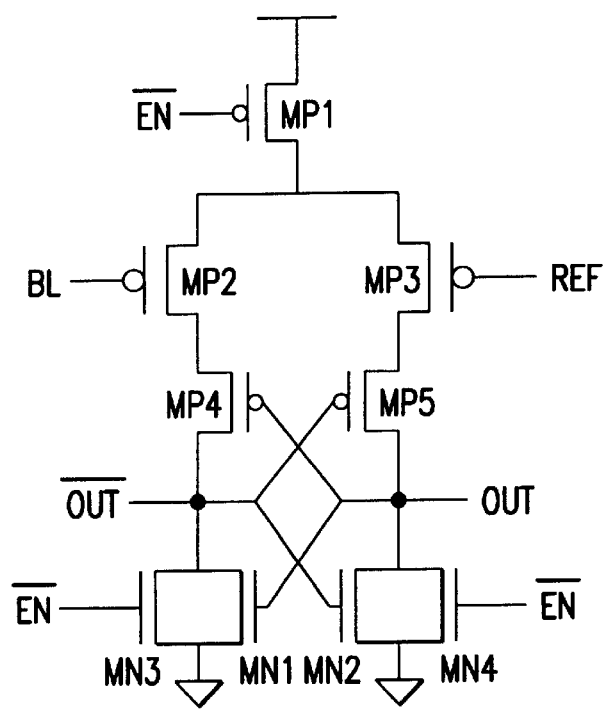
FIG. 5 illustrates the sense amplifier shown in FIG. 4.

FIG. 5 illustrates the sense amplifier 14 shown in FIG. 3. A third p-channel transistor $MP_1$ has its source connected to power and its drain connected to the first and second leg. Each leg includes two serially connected p-channel transistors ($MP_2$, $MP_4$; $MP_3$, $MP_5$) followed by two parallel connected n-channel transistors ($MN_3$, $MN_1$; $MN_2$, $MN_4$).

For the first leg, at the OUT bar port, the node between the drain of the second p-channel transistor $MP_4$ and the drains of the two parallel connected n-channel transistors $MN_3$, $MN_1$ are connected to the gate of the second p-channel transistor $MP_5$ of the second leg and the gate of the n-channel transistor $MN_2$. For the second leg, at the OUT port, the node between the drain of the second p-channel transistor $MP_5$ and the drains of the two parallel connected n-channel transistors $MN_2$, $MN_4$ are connected to the gate of the second p-channel transistor $MP_4$ of the first leg and the gate of the second n-channel transistor $MN_1$.

Figure 6:
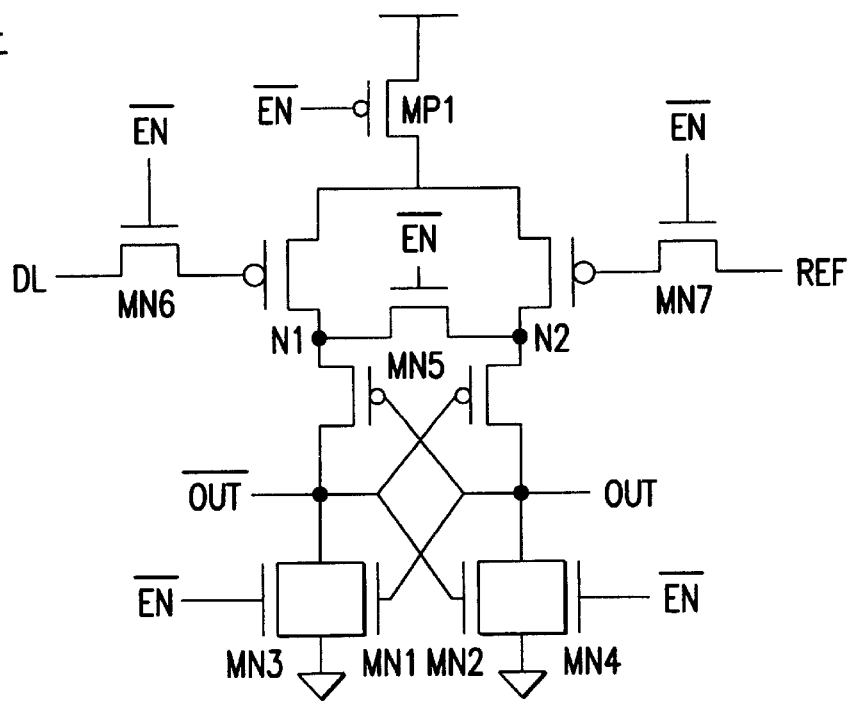
FIG. 6 illustrates the optional data buffer shown in FIG. 5.

FIG. 6 illustrates an alternate embodiment for the sense amplifier shown in FIG. 3. In addition to the electrical connectivity as described in FIG. 5, a fifth n-channel transistor $MN_5$ connects nodes $N_1$ and $N_2$ and is used for equalization. A sixth n-channel transistor MN6 is serially connected to the gate of p-channel transistor $MP_2$. A seventh n-channel transistor $MN_7$ is serially connected to the gate of the p-channel transistor $MP_3$. The gates of n-channel transistors $MN_5$, MN6, and $MN_7$ are connected to EN bar. N-channel transistors MN6 and $MN_7$ are isolation devices.

Figure 7:
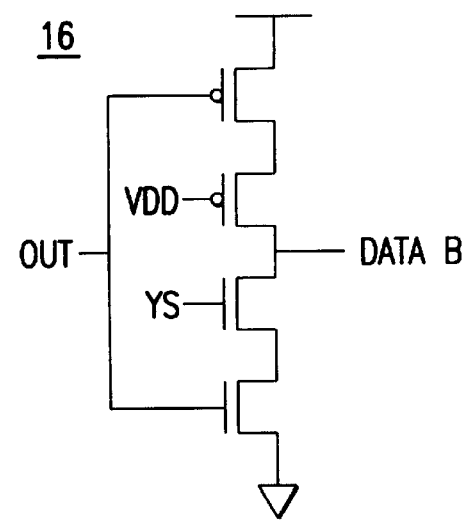
FIG. 7 illustrates the optional data buffer 16 shown in FIG. 3.

FIG. 7 illustrates the optional data buffer 16 shown in FIG. 3. A first and a second p-channel transistor are serially connected between power and port DATA. The gate of the first p-channel transistor receives signal OUT, while the gate of the second p-channel transistor receives signal VDD. Two n-channel transistors are serially connected between port DATA and ground. The gate of the first n-channel transistor connects to OUT while the gate of the second n-channel transistor receives signal YS.

In operation, the lack of write-back capability inherent in the standalone sense amplifier is overcome by the addition of the series p-channel and series n-channel transistors tied to BL, which in a memory array would be the bit or data line. WB and WBB are additional complementary control signals that are generated after the sense amplifier has been activated by applying VSS to EN bar and VDD to EN after OUT and OUT bar have been driven to their full logic levels. Simultaneous with the write-back restore on the bit line, data can be accessed via the YS signal and started on its path to the chip's data output buffer, irrespective of the time required to accomplish the write-back.

We claim:

1. A sensing circuit having independent write-back capability comprising:
   a sense amplifier that compares an input signal to a reference signal and generates an output signal, the sense amplifier including,
      a p-channel transistor having a source connected to power and first drain,
      a first and a second leg, each leg connected to the drain of the p-channel transistor and ground, each leg further including,
         a first p-channel transistor having a source connected to the first drain,
         a second p-channel transistor having a source connected to the drain of the first p-channel transistor at a first node,
         two n-channel transistors, connected in parallel, having their drains connected to the drain of the second p-channel transistor at a second node and their sources connected to ground,
         a third n-channel transistor, serially connected to the gate of the first p-channel transistor, and
         for each leg, the second node connects to the gates of the second p-channel transistor and one of the two n-channel transistors of the other leg, and
      a first n-channel transistor, connected across the first nodes of the first and second legs;
   a tri-stable write-back block having an enable signal and a write-back output signal that coupled to the output signal of the sense amplifier; and
   a data buffer receiving the output signal of the sense amplifier.

2. A sensing circuit having independent write-back capability comprising:
   a sense amplifier which compares an input to a reference signal and generates an output signal;
   a tri-statable write-back block having an enable signal and a write-back output signal that is coupled to the output signal of the sense amplifier; and
   a data buffer receiving the output signal of the sense amplifier, the data buffer including,
      a first n-channel transistor, having a drain generating a data-out signal, having a gate receiving a control signal, and
      a second p-channel transistor, having a drain connected to the source of the first n-channel transistor, a source connected to ground, and a gate receiving the output signal of the sense amplifier.

3. The data buffer of claim 2, further including:
   a first p-channel transistor, having a source connected to power, a gate receiving the output signal of the sense amplifier and a drain; and
   a second p-channel transistor, connected to the drain of the first p-channel transistor and the drain of the first n-channel transistor, having a gate connected to VDD.

4. The data buffer of claim 2, further including:
   a first p-channel transistor, having a source connected to power, a gate receiving the output signal of the sense amplifier and a drain; and
   a second p-channel transistor, connected to the drain of the first p-channel transistor and the drain of the first n-channel transistor, having a gate connected to the complement of the gate control signal of the first n-channel transistor.

5. A sensing circuit having independent write-back capability comprising:
   a sense amplifier which compares an input signal to a reference signal and generates an output signal; and
   a tri-statable write-back block, having an enable signal and a write-back output signal that is coupled to the output signal of the sense amplifier, including,
      the first p-channel transistor having a source connected to power,
      a second p-channel transistor having a source connected to the drain of the first p-channel transistor,
      a first n-channel transistor, having a rain connected to the drain of the second p-channel transistor forming the write-back output signal which is connected to the input signal, and
      a second n-channel transistor, having a drain connected to the source of the first n-channel transistor, having a source connected to ground,
      wherein the gates of the first p-channel and second n-channel transistors receive a complementary output signal.

6. A sense amplifier comprising:
   a p-channel transistor having a source connected to power and a first drain;
   a first and a second leg, each leg connected to the drain of the p-channel transistor and ground, each leg further including,
      a first p-channel transistor having a source connected to the first drain,
      a second p-channel transistor having a source connected to the drain of the first p-channel transistor at a first node,
      two n-channel transistors, connected in parallel, connected to the drain of the second p-channel transistor at a second node and ground,
      a third n-channel transistor, serially connected to the gate of the first p-channel transistor, and
      for each leg, the second node connects to the second p-channel transistor and one of the two n-channel transistors of the other leg; and
   a first n-channel transistor, connected across the first nodes of the first and second legs.

* * * * *